(12) United States Patent
Taylor et al.

(10) Patent No.: US 10,903,065 B2
(45) Date of Patent: Jan. 26, 2021

(54) HALOGEN REMOVAL MODULE AND ASSOCIATED SYSTEMS AND METHODS

(71) Applicant: Lam Research Corporation, Fremont, CA (US)

(72) Inventors: Travis R. Taylor, Portland, OR (US); Adam Bateman, Fremont, CA (US); Todd A. Lopes, Livermore, CA (US); Sankaranarayanan Ravi, Fremont, CA (US); Silvia Aguilar, San Jose, CA (US); Derek Witkowicki, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 107 days.

(21) Appl. No.: 15/594,118

(22) Filed: May 12, 2017

(65) Prior Publication Data
US 2018/0330942 A1 Nov. 15, 2018

(51) Int. Cl.
*H01L 21/02* (2006.01)
*H01L 21/67* (2006.01)
*H01L 21/687* (2006.01)

(52) U.S. Cl.
CPC .... *H01L 21/02057* (2013.01); *H01L 21/6719* (2013.01); *H01L 21/67109* (2013.01);
(Continued)

(58) Field of Classification Search
CPC ......... H01L 21/02043; H01L 21/02046; H01L 21/02052; H01L 21/02054; H01L 21/02057; H01L 21/0206; H01L 21/02063; H01L 21/02065; H01L 21/02068; H01L 21/02071; H01L 21/02074; H01L 21/02076; H01L 21/02079; H01L 21/67017; H01L 21/67023; H01L 21/67028; H01L 21/67034; H01L 21/6704; H01L 21/67098; H01L 21/67103; H01L 21/67109; H01L 21/67115
See application file for complete search history.

(56) References Cited

U.S. PATENT DOCUMENTS 3,855,024 A * 12/1974 Lim ................. H01L 21/02019
438/706
4,778,532 A * 10/1988 McConnell ............ B05C 3/109
134/10

(Continued)

*Primary Examiner* — David G Cormier
(74) *Attorney, Agent, or Firm* — Penilla IP, APC

(57) ABSTRACT

A chamber is formed to enclose a processing region. A passageway is configured to provide for entry of a substrate into the processing region and removal of the substrate from the processing region. A substrate support structure is disposed within the processing region and configured to support the substrate within the processing region. At least one gas input is configured to supply one or more gases to the processing region. At least one gas output is configured to exhaust gases from the processing region. A humidity control device is configured to control a relative humidity within the processing region. At least one heating device is disposed to provide temperature control of the substrate within the processing region. The processing region of the chamber is directly accessible from a substrate handling module configured to operate at atmospheric pressure.

26 Claims, 12 Drawing Sheets

(52) U.S. Cl.
 CPC .. *H01L 21/67207* (2013.01); *H01L 21/67248* (2013.01); *H01L 21/67253* (2013.01); *H01L 21/68742* (2013.01)

(56) References Cited

U.S. PATENT DOCUMENTS

| | | | | |
|---|---|---|---|---|
| 5,709,757 | A * | 1/1998 | Hatano | B08B 7/00 118/715 |
| 2006/0207971 | A1* | 9/2006 | Moriya | C23F 1/12 216/67 |
| 2009/0013932 | A1* | 1/2009 | Sakamoto | H01L 21/0276 118/719 |
| 2012/0051872 | A1* | 3/2012 | Ku | H01L 21/67201 414/217.1 |
| 2018/0182612 | A1* | 6/2018 | Fukuoka | H01L 21/67288 |

* cited by examiner

| Phase 1 (Cool) | | | | | |
|---|---|---|---|---|---|
| Time (Duration) | Gas Type | Flow Rate | Humidity | Temp. | Pressure |
| 4 min. | N2 | 50 slm | 100% | 23° C | 755 Torr |
|  | O2 | 0 slm |  |  |  |
|  | Air | 10 slm |  |  |  |
| 6 min. | N2 | 50 slm | 100% | 23° C | 755 Torr |
|  | O2 | 25 slm |  |  |  |
|  | Air | 10 slm |  |  |  |

Add Step

| Phase 2 (Hot) | | | | | |
|---|---|---|---|---|---|
| Time (Duration) | Gas Type | Flow Rate | Humidity | Temp. | Pressure |
| 2 min. | N2 | 50 slm | 95% | 100° C | 755 Torr |
|  | O2 | 0 slm |  |  |  |
|  | Air | 10 slm |  |  |  |
| 3 min. | N2 | 0 slm | 95% | 175° C | 755 Torr |
|  | O2 | 0 slm |  |  |  |
|  | Air | 160 slm |  |  |  |

Add Step

1201

For a first period of time, expose the substrate to a flow of at least one gas while maintaining a relative humidity in exposure to the substrate at about 100% and while maintaining a temperature of the substrate within a range extending from about 20° C to about 26° C, where the first period of time is set to allow for a substantially complete off-gassing of fluorine from the substrate.

1203

For a second period of time following the first period of time, expose the substrate to a flow of at least one gas while maintaining a relative humidity in exposure to the substrate within a range extending from about 50% to about 100% and while maintaining a temperature of the substrate within a range extending from about 60° C to about 200° C, where the second period of time is set to allow for a substantially complete off-gassing of bromine and chlorine from the substrate.

Fig. 12

HALOGEN REMOVAL MODULE AND ASSOCIATED SYSTEMS AND METHODS

BACKGROUND

1. Field of the Invention

The present invention relates to semiconductor device fabrication.

2. Description of the Related Art

Many modern semiconductor chip fabrication processes include exposure of a substrate to halogen materials, including fluorine and/or chlorine and/or bromine and/or iodine. For example, some etching processes among other types of processes can include use of halogen materials. After completion of these fabrication processes, the halogen materials can remain on the substrate and can off-gas from the substrate, potentially causing damage to the substrate by defect formation and/or by water cluster formation leading to void formation in subsequent processing operations. Also, halogens that off-gas from the substrate can cause damage (corrosion) to exposed fabrication facility equipment, such as to airlocks and equipment front end modules (EFEMs), among other types of fabrication facility equipment, resulting in defects, shorter mean time between clean (MTBC), and shorter parts lifetime, which leads to increased cost of consumables (CoC). It is within this context that the present invention arises.

SUMMARY

In an example embodiment, a halogen removal module is disclosed. The halogen removal module includes a chamber formed to enclose a processing region. The halogen removal module includes a passageway into the chamber. The passageway is configured to provide for entry of a substrate into the processing region and removal of the substrate from the processing region. The halogen removal module includes a substrate support structure disposed within the processing region and configured to support the substrate within the processing region. The halogen removal module includes at least one gas input configured to supply one or more gases to the processing region. The halogen removal module includes at least one gas output configured to exhaust gases from the processing region. The halogen removal module includes a humidity control device configured to control a relative humidity within the processing region. The halogen removal module includes at least one heating device disposed to provide temperature control of the substrate within the processing region.

In an example embodiment, a method is disclosed for managing one or more residual halogens emanating from a substrate. The method includes a first operation in which, for a first period of time, the substrate is exposed to a flow of at least one gas while maintaining a relative humidity in exposure to the substrate within a range extending from about 70% to about 100%, and while maintaining a temperature of the substrate within a range extending from about 20° C. to about 26° C. The first period of time is set to allow for a substantially complete off-gassing of fluorine from the substrate. The method also includes a second operation in which, for a second period of time following the first period of time, the substrate is exposed to a flow of at least one gas while maintaining a relative humidity in exposure to the substrate within a range extending from about 50% to about 100%, and while maintaining a temperature of the substrate within a range extending from about 60° C. to about 200° C. The second period of time is set to allow for a substantially complete off-gassing of bromine and chlorine from the substrate. The substrate is maintained in a same location, i.e., in a same processing environment, during both the first period of time and the second period of time. In some embodiments, if the substrate has only one halogen material to be managed, either the first operation or the second operation can be performed on the substrate, as appropriate for managing the one halogen material.

In an example embodiment, a system is disclosed for managing residual halogens emanating from a substrate. The system includes a chamber configured to attach to a substrate handling module. The chamber is formed to enclose a processing region. The substrate handling module is configured to maneuver substrates within an environment at atmospheric pressure. The system also includes a passageway into the chamber to provide for transfer of a substrate between the environment within substrate handling module and the processing region within the chamber. The system also includes a substrate support structure disposed within the processing region within the chamber. The substrate support structure is configured to hold the substrate when present in the processing region within the chamber. The system also includes a control system configured to control supply of one or more gases to the processing region within the chamber. The control system is also configured to control an exhaust of gases from the processing region within the chamber. The control system is also configured to control a relative humidity within the processing region within the chamber. The control system is also configured to control a temperature of the substrate when present in the processing region within the chamber.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 12 shows a flowchart of a method for managing residual halogens emanating from a substrate, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In the semiconductor industry, a semiconductor substrate can be subjected to various types of fabrication processes in which the substrate is exposed to one or more halogen materials, including fluorine, chlorine, bromine, and iodine. It is desirable to remove residual halogen materials from the substrate in a controlled manner to avoid damage to the substrate and/or to fabrication facility equipment that may be exposed to halogens emitted from the substrate. For example, halogen materials may be used in some conductor etching processes in semiconductor chip fabrication, and lead to some post-processing halogen management considerations.

One such post-processing halogen management consideration concerns halogen materials remaining on the substrate after the conductor etching process that can cause issues after the substrate leaves the conductor etching system, such as damage to films and/or structures present on the substrate and/or formation of particles that can adversely affect subsequent fabrication of the semiconductor chip, among other issues. Also, another post-processing halogen management consideration concerns halogen materials that are emitted, e.g., off-gas, from the substrate before the substrate leaves the conductor etching system, where the emission of these halogen materials from the substrate can lead to undesirable particle formation and corresponding damage.

In some embodiments, the substrate referred to herein is a semiconductor wafer undergoing a fabrication procedure. However, it should be understood that in various embodiments, the substrate can be essentially any type of substrate that is subjected to a semiconductor fabrication processing that involves halogen material(s). For example, in some embodiments, the term substrate as used herein can refer to substrates formed of sapphire, GaN, GaAs or SiC, SiN, photoresist (PR), or other substrate materials, and can include glass panels/substrates, metal foils, metal sheets, polymer materials, or the like. Also, in various embodiments, the substrate as referred to herein may vary in form, shape, and/or size. For example, in some embodiments, the substrate referred to herein may correspond to a 200 mm (millimeters) semiconductor wafer, a 300 mm semiconductor wafer, or a 450 mm semiconductor wafer. Also, in some embodiments, the substrate referred to herein may correspond to a non-circular substrate, such as a rectangular substrate for a flat panel display, or the like, among other shapes.

Figure 1:
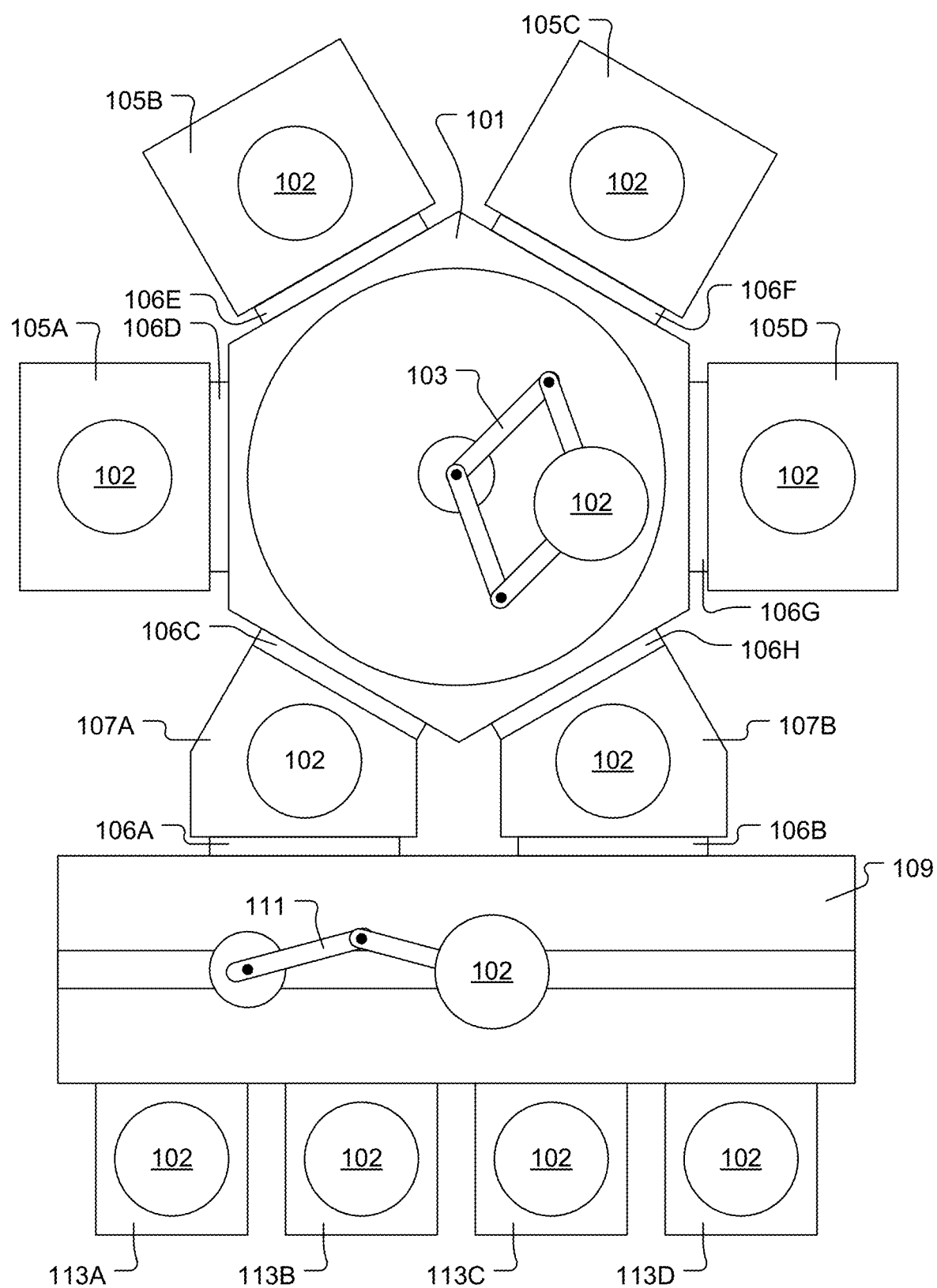
FIG. 1 shows an example equipment configuration within a semiconductor fabrication facility, in accordance with some embodiments of the present invention.

FIG. 1 shows an example equipment configuration within a semiconductor fabrication facility, in accordance with some embodiments of the present invention. The example equipment configuration includes a transfer module 101 configured to operate under a vacuum condition. The transfer module 101 includes a robotic substrate handling device 103 mounted therein. The transfer module 101 includes a number of facets to which one or more process modules 105A-105D are connected and to which one or more air lock modules 107A-107B are connected. The robotic substrate handling device 103 is configured to provide for transfer of a substrate 102 to and from any of the one or more air lock modules 107A-107B and to and from any of the one or more process modules 105A-105D.

The various process modules 105A-105D can be configured to perform essentially any type of manufacturing process on the substrate 102. For example, any of the one or more of the process modules 105A-105D can be configured to perform a material deposition process on the substrate 102, such as a chemical vapor deposition (CVD) process, a physical vapor deposition (PVD) process, a plasma-enhanced chemical vapor deposition (PECVD) process, an electrochemical deposition (ECD) process, an atomic layer deposition (ALD) process, a molecular beam epitaxy (MBE) process, or any other type of material deposition process used in manufacturing semiconductor devices. Also, by way of example, any of the one or more of the process modules 105A-105D can be configured to perform a material removal process on the substrate 102, such as a wet etching process, a dry etching process, a plasma-based etching process, an ion beam milling process, or any other type of material removal process used in manufacturing semiconductor devices. Also, by way of example, any of the one or more of the process modules 105A-105D can be configured to perform any other process or combination of processes known in manufacturing of semiconductor devices, such as a lithographic exposure process, an ion implantation process, a thermal process (annealing, thermal oxidation, etc.), a cleaning process (rinsing, plasma ashing, etc.), a chemical mechanical planarization/polishing (CMP) process, a testing procedure, among others.

The one or more air lock modules 107A-107B are connected to an equipment front end module (EFEM) 109. The EFEM 109 includes a robotic substrate handling device 111.

A number of load ports 113A-113D are connected to the EFEM 109. Each load port 113A-113D provides for docking of one or more substrate carrying devices, such as a front opening unified pod (FOUP), a front-opening shipping box (FOSB), a standard mechanical interface (SMIF) pod, among any other type of substrate carrying device used to transport substrates 102 throughout the fabrication facility. Generally speaking, the substrate carrying device can be configured as a magazine for holding one or more substrates 102 and for transporting substrates 102 between manufacturing tools. In various embodiments, the substrate carrying device can include features such as coupling structures and electronic identification mechanisms for use with an automated materials handling system of the fabrication facility. Also, the substrate carrying device can be configured to provide a sealed and controlled micro-environment for the substrate(s) 102 contained therein and to protect the substrate(s) 102 and the semiconductor fabrication facility from contamination. The load ports 113A-113B can be configured to manipulate a sealing mechanism, e.g., door, of the substrate carrying device to provide for access to the substrate(s) 102 therein by the robotic substrate handling device 111 of the EFEM 109.

The EFEM 109 is operated under atmospheric pressure conditions to move substrates 102 to and from the various substrate carrying devices present at the load ports 113A-113D, and to move substrates 102 to and from the one or more air lock modules 107A-107B. The one or more air lock modules 107A-107B are connected to the EFEM 109 by way of a corresponding door system 106A-106B. Also, each of the one or more air lock modules 107A-107B and the one or more process modules 105A-105D is connected to the transfer module 101 by way of a corresponding door system 106C-106H. Each of the door systems 106A-106H is configured to provide for transfer of the substrate 102 through the door system 106A-106H when in an open state, and provide for environmental isolation of regions on opposing sides of the door system 106A-106H when in a closed state. In various embodiments, the door systems 106A-106H can be semiconductor gate valves or any other type of device configured to withstand significant pressure differentials. Each of the one or more air lock modules 107A-107B is configured to provide a transition between the atmospheric pressure environment within the EFEM 109 and a low pressure environment, e.g., partial-vacuum to high-vacuum environment, within the transfer module 101. The environment within the transfer module 101 and the one or more process modules 105A-105D is controlled to provide for extremely low levels of particulates and airborne molecular contamination (AMC), both of which can cause damage to the substrates 102 undergoing fabrication. The one or more air lock modules 107A-107B function to provide for transfer of the substrate 102 between the EFEM 109 and the transfer module 101, while maintaining environmental separation between the EFEM 109 and the transfer module 101.

Figure 2:
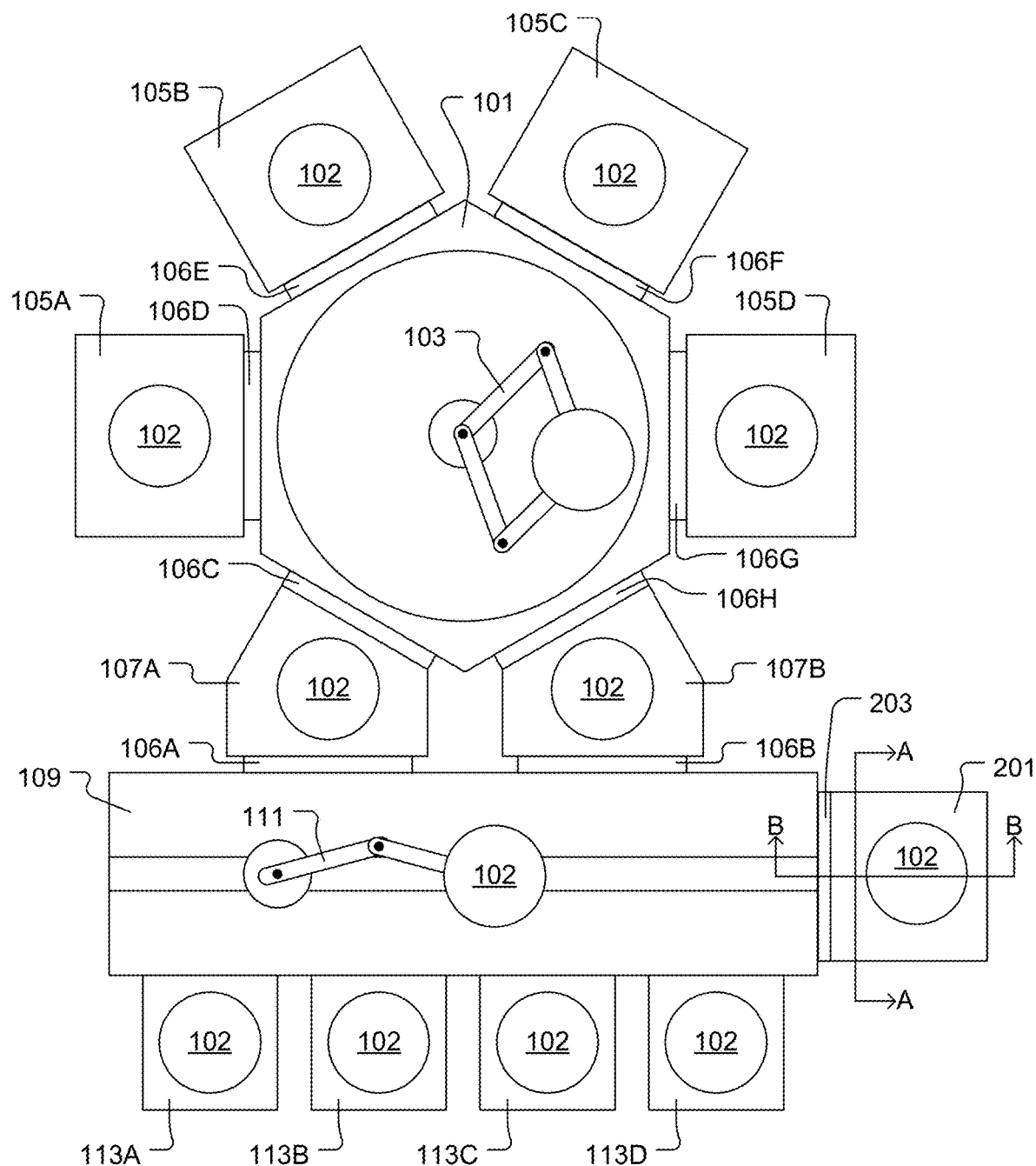
FIG. 2 shows the HRM connected to the EFEM, in accordance with some embodiments of the present invention.

As previously mentioned, the substrate 102 can be subjected to various types of fabrication processes that utilize one or more halogen materials, including fluorine, chlorine, and bromine. A halogen removal module (HRM) 201 and associated systems and methods are disclosed herein for managing residual halogens emanating from a substrate. FIG. 2 shows the HRM 201 connected to the EFEM 109, in accordance with some embodiments of the present invention. Generally speaking, the HRM 201 is configured to attach to a substrate handling module, such as the EFEM 109, where the substrate handling module is configured to maneuver substrates 102 within an environment at atmospheric pressure. So, it should be understood that in some embodiments the HRM 201 can be connected to other types of substrate handling modules, other than the EFEM 109, within the semiconductor device fabrication facility. However, for ease of description, the HRM 201 is described herein in the context of the HRM 201 being connected to the EFEM 109. The HRM 201 includes a passageway 202 through which the substrate 102 can be transferred from the environment within the EFEM 109 into a processing region within the HRM 201, vice-versa. In some embodiments, the HRM 201 includes a door 203 configured to cover the passageway 202. The door 203 can be configured to shield an environment exterior to the HRM 201 from the processing region within the HRM 201. In some embodiments, the door 203 is configured to allow a flow of gas from the environment exterior to the HRM 201 into the processing region of the HRM 201. And, in some embodiments, the door 203 is configured to seal the processing region within the HRM 201 from the environment exterior to the HRM 201.

Figure 3A:
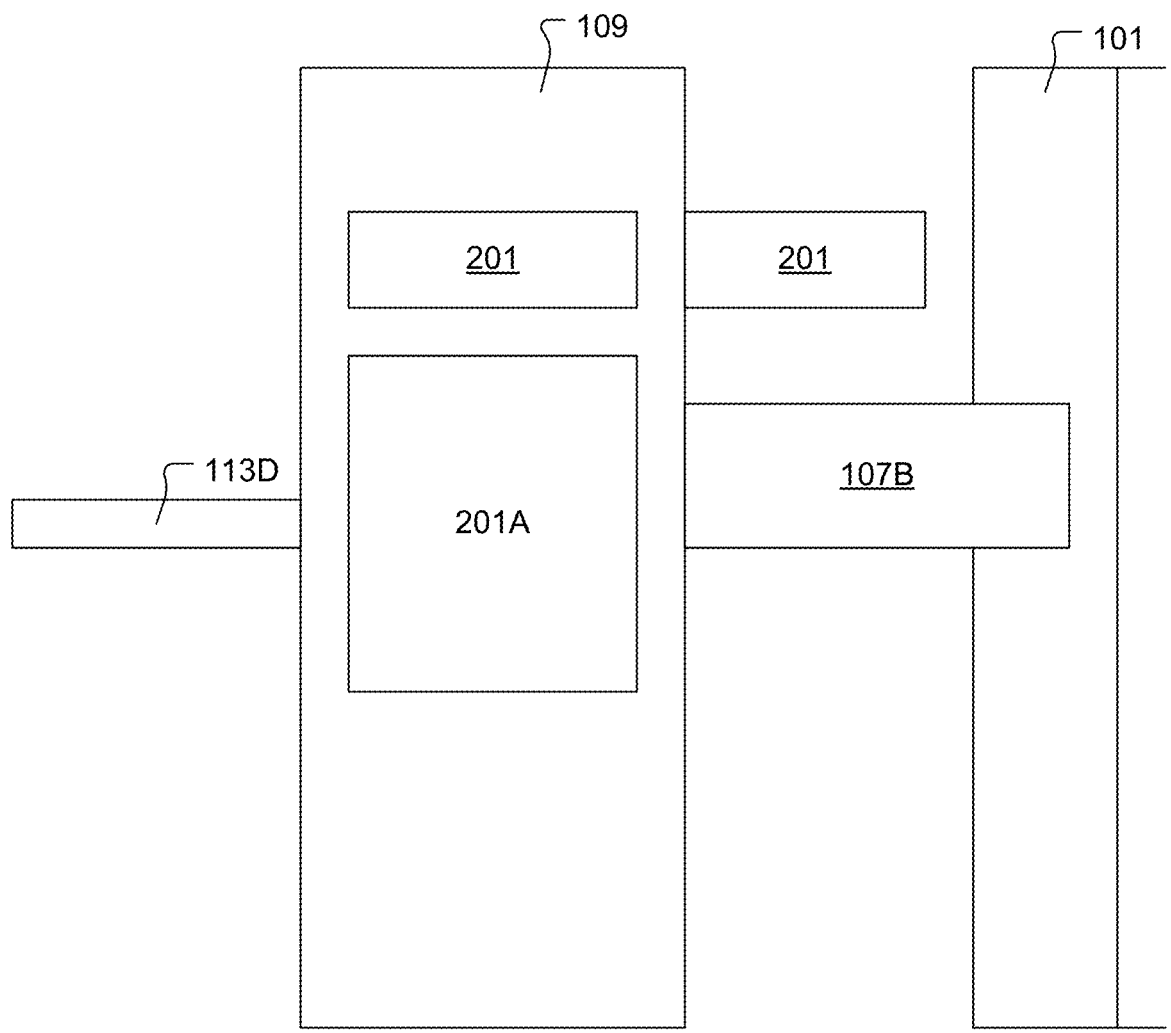
FIG. 3A shows a right-side view of the EFEM and the HRM of FIG. 2, in accordance with some embodiments of the present invention.
Figure 3B:
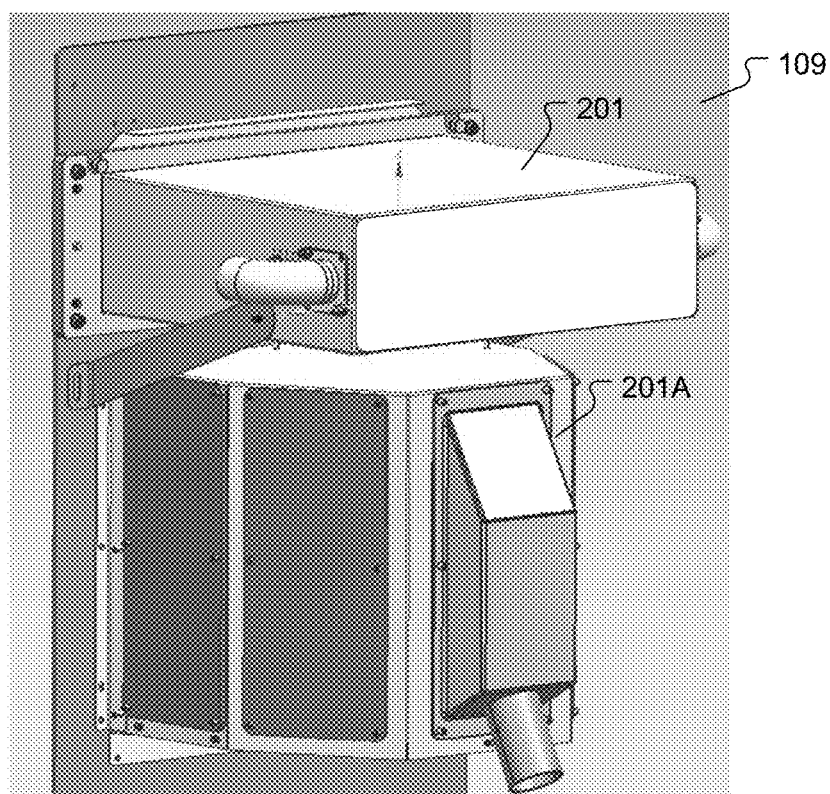
FIG. 3B shows a perspective view of the HRM and the HRM connected to the end panel of the EFEM, in accordance with some embodiments of the present invention.
Figure 3C:
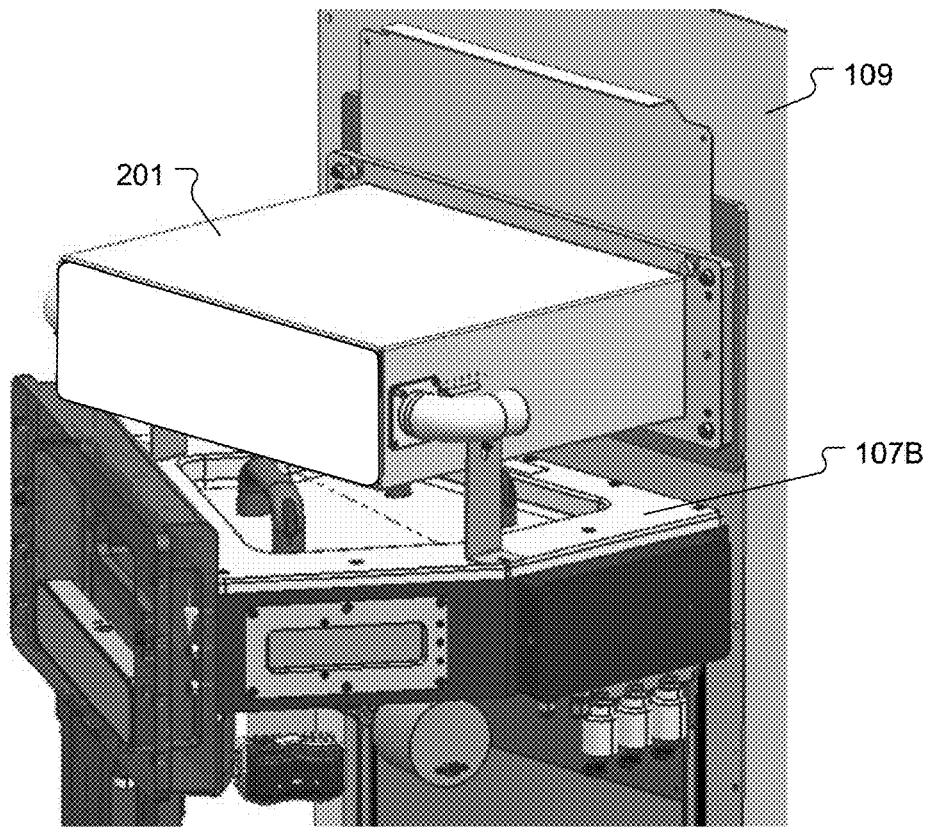
FIG. 3C shows a perspective view of the HRM connected to the EFEM at the location above the air lock module, in accordance with some embodiments of the present invention.

FIG. 3A shows a right-side view of the EFEM 109 and the HRM 201 of FIG. 2, in accordance with some embodiments of the present invention. In some embodiments, the HRM 201 is configured to process one substrate at a time. In some embodiments, an HRM 201A can be configured to process multiple substrates at a time. The HRM 201/201A can be connected to the EFEM 109 at any location that provides enough free space for connection of the HRM 201/201A and that is accessible by the robotic substrate handling device 111 of the EFEM 109. For example, FIG. 3A shows the HRM 201 and the HRM 201A connected to an end panel of the EFEM 109. FIG. 3B shows a perspective view of the HRM 201 and the HRM 201A connected to the end panel of the EFEM 109, in accordance with some embodiments of the present invention. FIG. 3A also shows how the HRM 201 can be connected to the EFEM 109 at a location above the air lock module 107B. It should be understood that one or more HRM's 201/201A can be connected to a given EFEM 109. FIG. 3C shows a perspective view of the HRM 201 connected to the EFEM 109 at the location above the air lock module 107B, in accordance with some embodiments of the present invention.

Figure 4A:
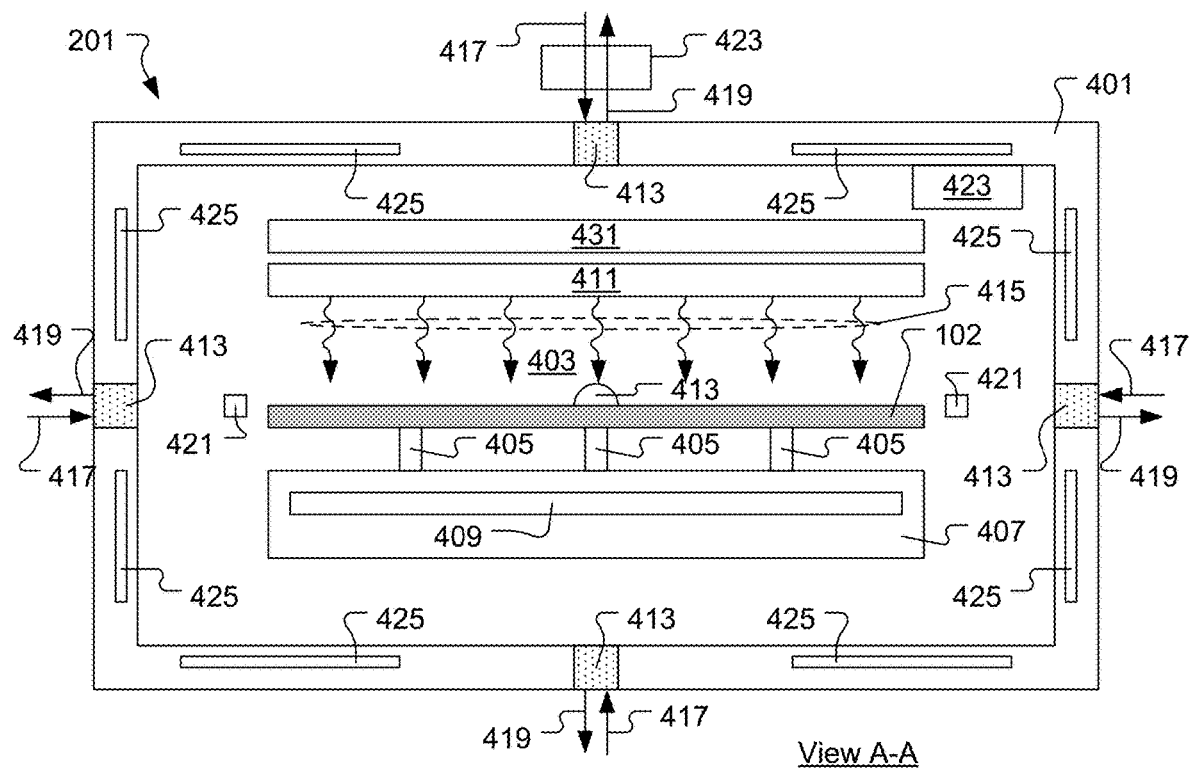
FIG. 4A shows the substrate disposed on a number of lift pins in a raised state, in accordance with some embodiments of the present invention.
Figure 4B:
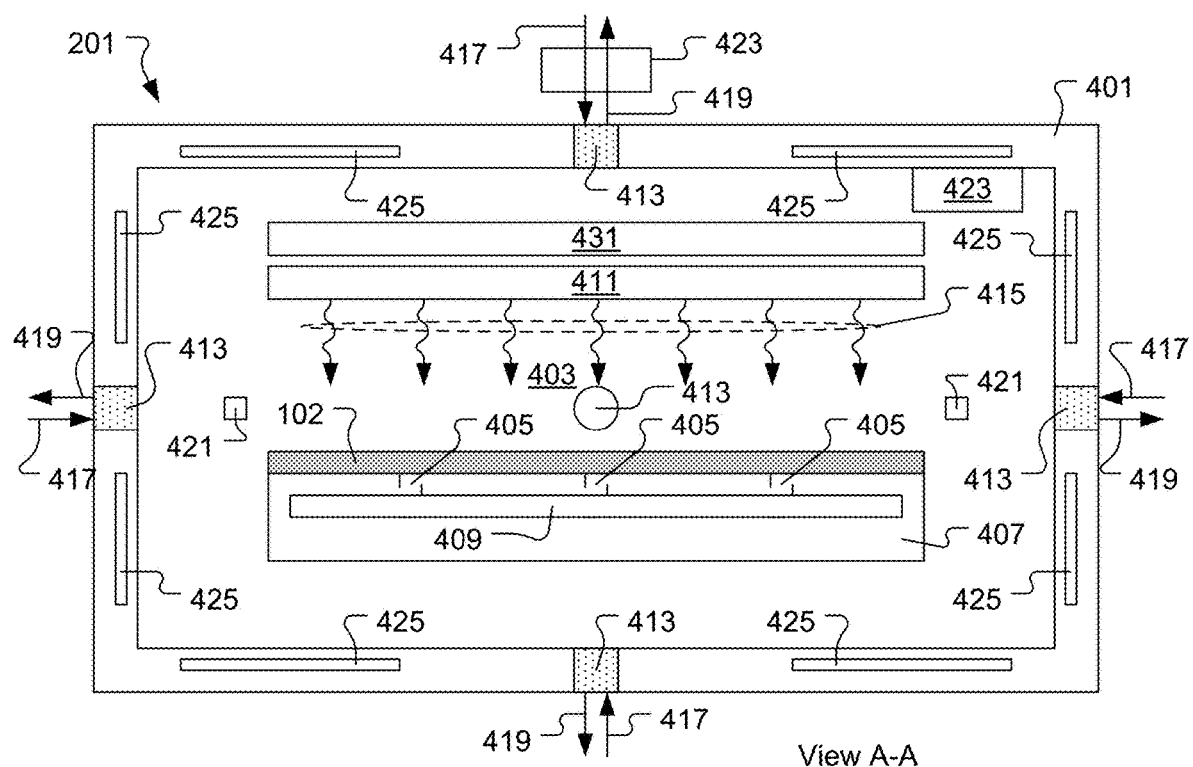
FIG. 4B shows the substrate disposed on a substrate support structure, with the number of lift pins in a lowered state within the substrate support structure, in accordance with some embodiments of the present invention.
Figure 4C:
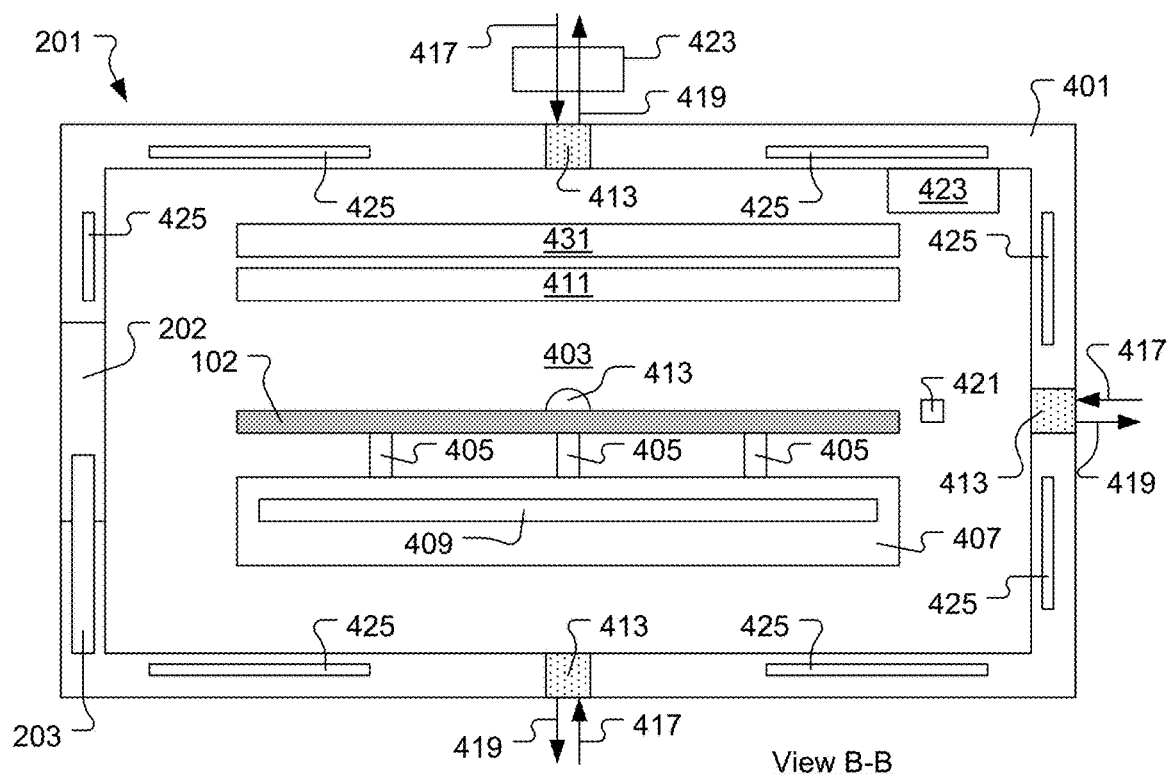
FIG. 4C shows the substrate disposed on the number of lift pins in the raised state, in accordance with some embodiments of the present invention.
Figure 4D:
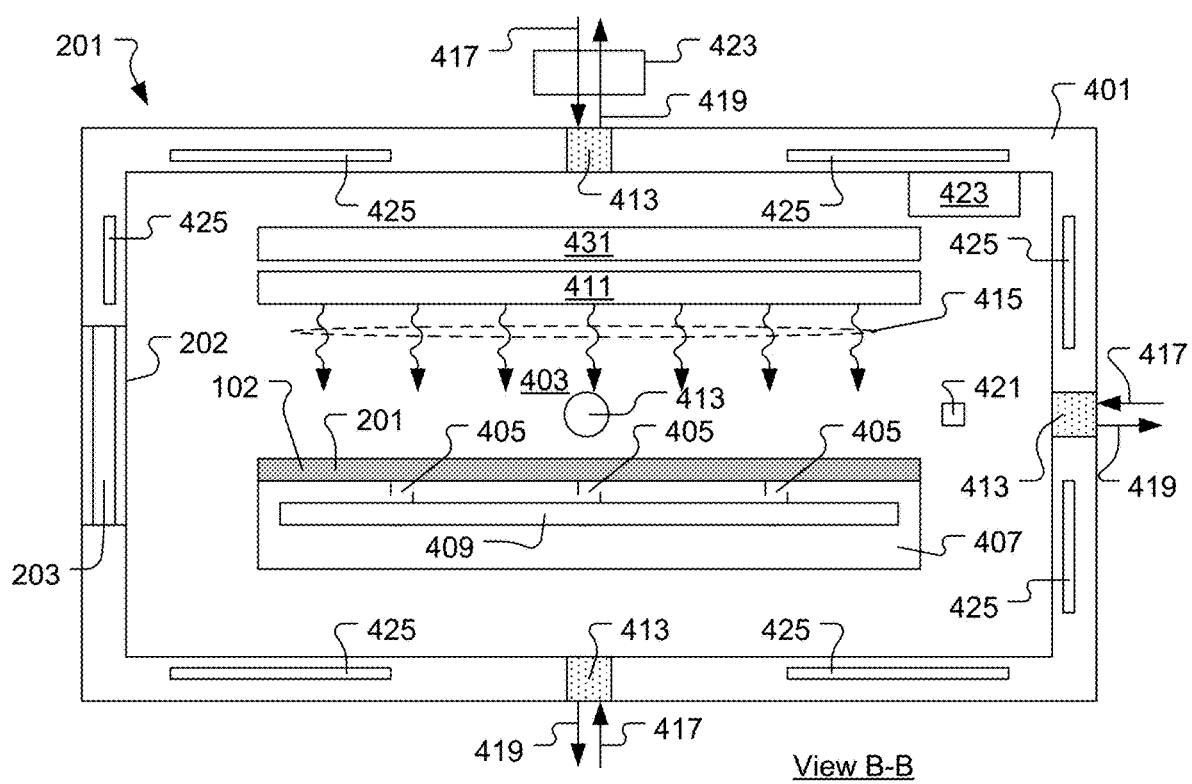
FIG. 4D shows the substrate disposed on the substrate support structure, with the number of lift pins in the lowered state within the substrate support structure, in accordance with some embodiments of the present invention.

FIGS. 4A and 4B show a vertical cross-section view through the HRM 201, referenced as View A-A in FIG. 2, in accordance with some embodiments of the present invention. FIGS. 4C and 4D show a vertical cross-section view through the HRM 201, referenced as View B-B in FIG. 2, in accordance with some embodiments of the present invention. The HRM 201 includes a chamber 401 formed to enclose a processing region 403. The chamber 401 can be formed of any material that is chemically compatible with materials present within the processing region 403, and that has sufficient mechanical strength to maintain stability of the HRM 201 in connection with the EFEM 109. In some embodiments, the chamber 401 is formed of one or more of an aluminum-based material, a stainless steel material, a composite material, a plastic material, an acrylic material, and a ceramic material, among others. The HRM 201 of FIGS. 4A-4B is configured to process one substrate 102 at a time.

FIG. 4A shows the substrate 102 disposed on a number of lift pins 405 in a raised state. FIG. 4B shows the substrate 102 disposed on a substrate support structure 407, with the number of lift pins 405 in a lowered state within the substrate support structure 407. FIG. 4C shows the substrate 102 disposed on the number of lift pins 405 in the raised state. FIG. 4D shows the substrate 102 disposed on the substrate support structure 407, with the number of lift pins 405 in the lowered state within the substrate support structure 407. The substrate support structure 407 is configured to support the substrate 102 within the processing region 403. In some embodiments, the number of lift pins 405 is three. However, in some embodiments the number of lift pins 405 is more than three. Also, in some embodiments, the HRM 201 may not utilize lift pins 405 to enable transfer of the substrate 102 into and out of the processing region 403, but may rather use an alternative structure for engaging the substrate 102 at a location above the substrate support structure 407 and for moving the substrate 102 to and from its resting position on the substrate support structure 407. For example, in some embodiments, a ring structure can be configured to engage the substrate 102 along an outer peripheral edge of the substrate 102, with the ring structure configured to move vertically relative to the substrate support structure 407 to facilitate positioning of the substrate 102 on the substrate support structure 407 and removal of the substrate 102 from the substrate support structure 407.

Figure 5:
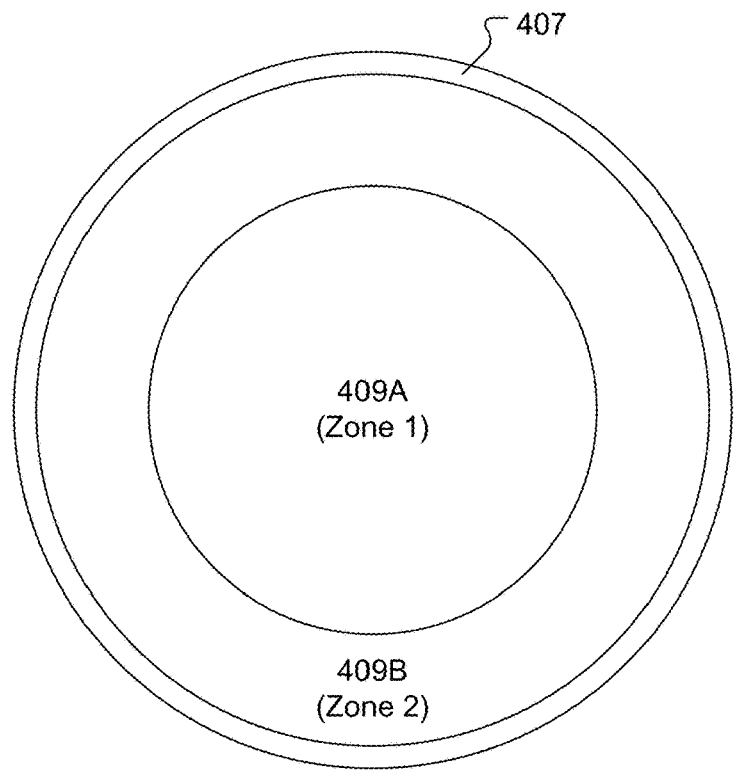
FIG. 5 shows a horizontal cross-section view of the substrate support structure in which the heating device includes a first independently controlled heating zone and a second independently controlled heating zone, in accordance with some embodiments of the present invention.

In some embodiments, the substrate support structure 407 is a pedestal having a top surface configured for supporting the substrate 102. Also, in some embodiments, at least one heating device 409 is disposed within the substrate support structure 407. In these embodiments, the substrate support structure 407 is formed of a material that is thermally conductive and that is chemically compatible with materials present within the processing region 403. For example, in some embodiments the substrate support structure 407 is formed of an aluminum-based material. In various embodiments, the heating device(s) 409 is an electrical resistance heating device, a radiant heating device, or a combination thereof. In some embodiments, the heating device(s) 409 can be configured to provide multiple zones of independently controlled heating relative to the substrate 102. For example, FIG. 5 shows a horizontal cross-section view of the substrate support structure 407 in which the heating device(s) 409 includes a first independently controlled heating zone 409A and a second independently controlled heating zone 409B, in accordance with some embodiments of the present invention. It should be understood that in various embodiments, the heating device(s) 409 can include any number of independently controlled heating zones as required for a halogen management process.

The HRM 201 can also include one or more radiant heating device(s) 411 disposed outside the substrate support structure 407 and within the processing region 403 to direct radiant heat toward the substrate 102 when present on the lift pins 405, or the like, and/or when present on the substrate support structure 407, as indicated by arrows 415. In various embodiments, the one or more radiant heating device(s) 411 can be light emitting diode(s) (LEDs), and/or halogen bulbs, and/or incandescent bulbs, and/or infrared lamps, and/or other types of devices capable of emitting radiant heat in a controlled manner. It should be understood that the at least one heating device 409 and the one or more radiant heating device(s) 411 are connected to a control system, with the control system programmed to direct operation of the at least one heating device 409 and the one or more radiant heating device(s) 411 as required by a halogen management process. Also, it should be understood that the at least one heating device 409 and the one or more radiant heating device(s) 411 are disposed to provide temperature control of the substrate 102 within the processing region 403. Also, in various embodiments, the HRM 201 can include just the at least one heating device 409 and not the one or more radiant heating device(s) 411, or just the one or more radiant heating device(s) 411 and not the at least one heating device 409, or both the at least one heating device 409 and the one or more radiant heating device(s) 411.

The HRM 201 also includes a number of gas ports 413. At a given time, each of the gas ports 413 can be operated as either a gas input (as indicated by arrows 417) or a gas output (as indicated by arrows 419) by operating one or more valves connected to the gas ports 413. At a given time, at least one of the gas ports 413 provides at least one gas input for supplying one or more gases to the processing region 403, and at least one of the gas ports 413 provides at least one gas output for exhausting gases from the processing region 403. In various embodiments, the gas ports 413 can be operated to supply either a single gas or a combination of gases to the processing region. In various embodiments, one or more gas ports 413 can be connected to supply one or more of oxygen gas, nitrogen gas, air, and/or other process gas to the processing region 403. Also, in various embodiments, the gas ports 413 can be located around the processing region 403 in essentially any spatial configuration. In some embodiments, one or more of the gas ports 413 can be fluidly connected to the environment within the EFEM 109.

In some embodiments, at a given time, some of the gas ports 413 can be operated as gas input(s) and some of the gas ports 413 can be operated as gas output(s) so as to establish a desired gas flow pattern through the processing region 403 relative to the substrate 102, i.e., to provide a controlled gas flow profile across the substrate 102. For example, in some embodiments, gas ports 413 located on the front of the HRM 201 can be operated as gas inputs and gas ports 413 located on the back of the HRM 201 can be operated as gas outputs for exhaust. As another example, in some embodiments, gas ports 413 located on the top of the HRM 201 can be operated as gas inputs and gas ports 413 located on the bottom of the HRM 201 can be operated as gas outputs for exhaust. It should understood that the various gas ports 413 can be controlled to operate as gas inputs or gas outputs at a given time to create a desired input gas flow pattern through the processing region 403 of the HRM 201. Also, the spatial distribution of input gas flows relative to the substrate 102 can vary in different embodiments. For example, in some embodiments, the spatial distribution of input gas flows relative to the substrate 102 can be optimized to direct more input gas flow onto portions of the substrate 102 that are known to include higher concentrations of halogen material(s). And, in some embodiments, the spatial distribution of input gas flows relative to the substrate 102 may not be of concern, so long as an entirety of the substrate 102 is exposed to some of the input gas flow. It should be understood that the spatial configuration of the gas ports 413 as shown in FIG. 4A is provided by way of example in accordance with some embodiments and is not intended to be limiting for other embodiments.

Figure 6:
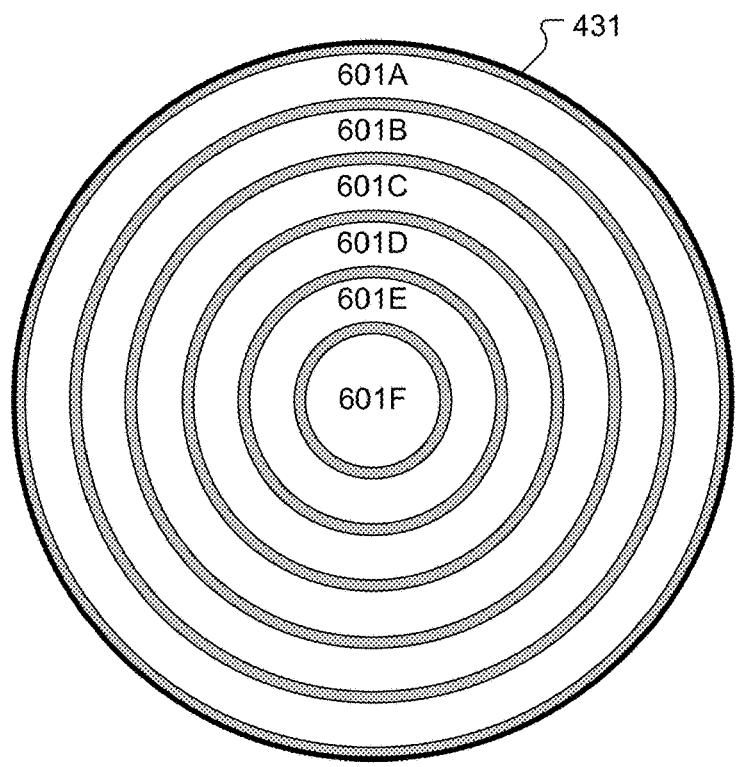
FIG. 6 shows a horizontal cross-section view through the gas dispense device, in accordance with some embodiments of the present invention.

Also, in some embodiments, the HRM 201 can include a gas dispense device 431 configured to receive an input gas supply from one or more of the gas ports 413 and dispense the input gas toward the substrate 102 in a prescribed spatial manner, such as in a substantially uniform manner across the substrate 102 or in a crossflow manner across the substrate 102 or in a center-to-periphery manner over the substrate 102, or in some other spatial manner. FIG. 6 shows a horizontal cross-section view through the gas dispense device 431, in accordance with some embodiments of the present invention. The gas dispense device 431 of FIG. 6 includes a number of gas channels 601A-601F. In some embodiments, the gas channels 601A-601F are defined as annular-shaped channels, such as shown in FIG. 6. However, in other embodiments, the gas channels 601A-601F can have other, non-annular shapes, and can be distributed in different arrangements across the gas dispense device 431. Also, in various embodiments, the gas dispense device 431 can have either more or less gas channels than what is shown for the gas channels 601A-601F in the example of FIG. 6. In some embodiments, the gas channels of the gas dispense device 431 are configured as discreet ports on the underside (substrate 102 facing side) of the gas dispense device 431. Also, in some embodiments, one or more of the gas channels 601A-601F of the gas dispense device 431 can be connected to an exhaust by way of one or more gas ports 413, while others of the one or more of the gas channels 601A-601F of the gas dispense device 431 is/are connected to a gas input supply by way of one or more gas ports 413. For example, in some embodiments, gas channels 601A, 601C, and 601E of the gas dispense device 431 of FIG. 6 are connected to an exhaust by way of one or more gas ports 413, and gas channels 601B, 601D, and 601F are connected to a gas input supply by way of one or more gas ports 413.

Figure 7:
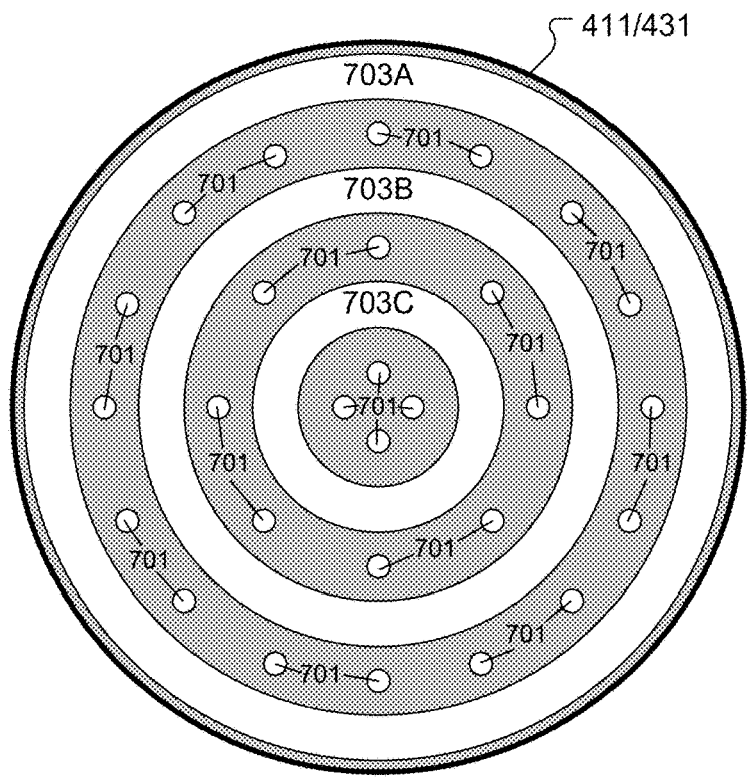
FIG. 7 shows a horizontal cross-section view through an integrated heating and gas dispense device, in accordance with some embodiments of the present invention.

Also, in some embodiments, the one or more radiant heating device(s) 411 and the gas dispense device 431 can be integrated together into a same device. For example, FIG. 7 shows a horizontal cross-section view through an integrated heating and gas dispense device 411/431, in accordance with some embodiments of the present invention. The integrated heating and gas dispense device 411/431 includes a number of gas channels 703A-703C and a number of radiant heating devices 701 disposed among and between the gas channels 703A-703C. In some embodiments, one or more of the gas channels 703A-703C can be connected to an exhaust by way of one or more gas ports 413, while others of the one or more of the gas channels 703A-703C is/are connected to a gas input supply by way of one or more gas ports 413. In various embodiments, the radiant heating devices 701 can be LEDs, and/or halogen bulbs, and/or incandescent bulbs, and/or infrared lamps, and/or other types of devices capable of emitting radiant heat in a controlled manner.

The HRM 201 also has a humidity control device 423 connected and configured to control a relative humidity within the processing region 403. In some embodiments, the humidity control device 423 is connected in line with a gas supply to one or more of the gas ports 413, so as to provide for conditioning of a relative humidity in the gas transmitted through the one or more gas ports 413. In some embodiments, the humidity control device 423 is disposed directly within the processing region 403. It should be understood that the humidity control device 423 is connected to a control system, with the control system programmed to direct operation of the humidity control device 423 as required by a halogen management process. Also, it should be understood that in some embodiments the HRM 201 can include multiple humidity control devices 423.

The HRM 201 can also have a number of sensors 421 disposed therein for measuring one or more of temperature, pressure, relative humidity, or any other measurable parameter within the processing region 403 and/or directly on the substrate 102 and/or on the substrate support structure 407. Additionally, the HRM 201 can include one or more heating devices 425 disposed to heat surfaces of the chamber 401 exposed to the processing region 403 to prevent and/or mitigate buildup of halogen materials and/or other byproduct materials on the surfaces of the chamber 401. Also, in some embodiments, the one or more heating devices 425 can be operated to heat the walls of the chamber 401 to contribute to convective heating of gases within the processing region 403. In various embodiments, the one or more heating devices 425 is an electrical resistance heating device, a radiant heating device, or a combination thereof. The one or more heating devices 425 are connected to a control system, with the control system programmed to direct operation of the one or more heating devices 425 as required by a halogen management process.

Figure 8:
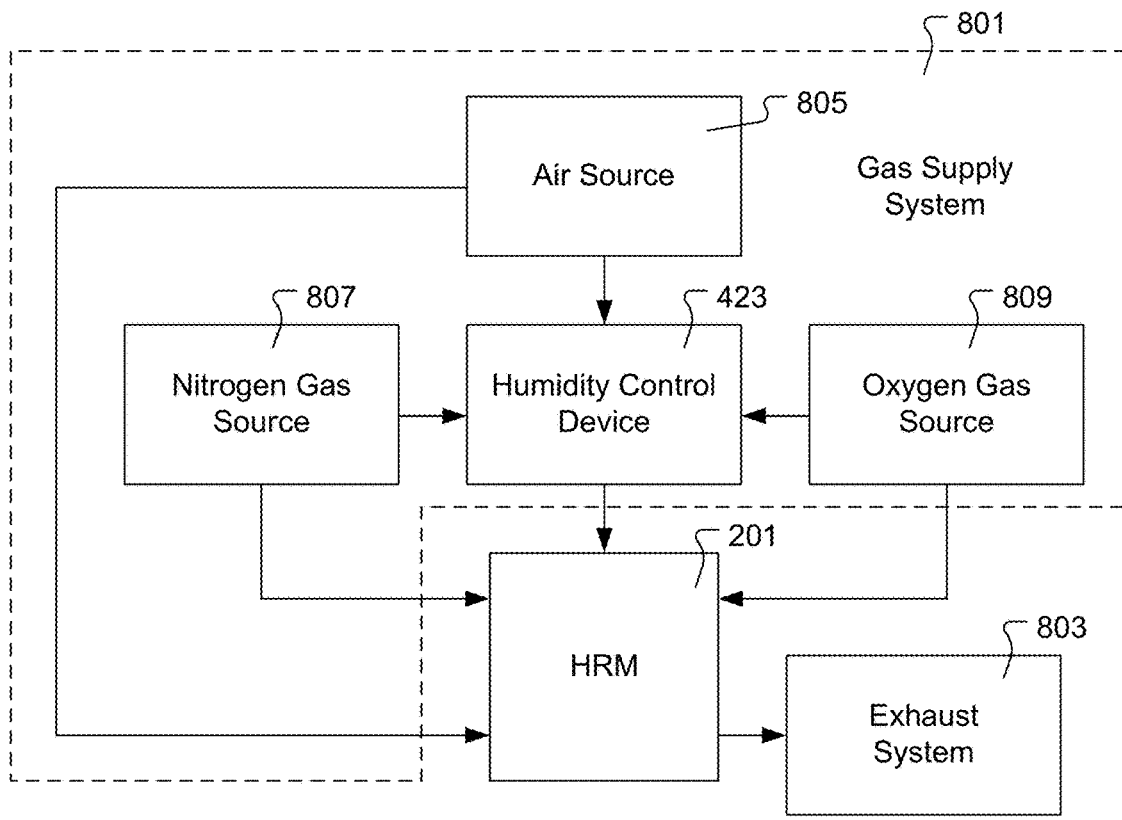
FIG. 8 shows a system-level diagram of the HRM connected to a gas supply system and an exhaust system, in accordance with some embodiments of the present invention.

FIG. 8 shows a system-level diagram of the HRM 201 connected to a gas supply system 801 and an exhaust system 803, in accordance with some embodiments of the present invention. The gas supply system 801 includes an air source 805, a nitrogen gas source 807, and an oxygen gas source 809. In some embodiments, the gas supply system 801 can also include sources for other types of gases or combinations of gases. In some embodiments, the gas supply system 801 is configured to enable transmission of any process gas (air, nitrogen, oxygen, etc.) from its respective source through the humidity control device 423 in route to the HRM 201. The humidity control device 423 is configured to control an amount of water vapor present within the gas flow to the HRM 201. Also, the gas supply system 801 can be configured to enable transmission of any process gas (air, nitrogen, oxygen, etc.) from its respective source directly to the HRM 201, so as to bypass the humidity control device 423. In some embodiments, the provision of any process gas (air, nitrogen, oxygen, etc.) from its source to the HRM 201 either directly or by way of the humidity control device 423 can be programmably selected for a given halogen management process. For example, one step of a given halogen management process may require a flow of oxygen directly from the oxygen gas source 809 to the HRM 201, while another step of the given halogen management process requires a flow of oxygen through the humidity control device 423 in route to the HRM 201. Also, it should be understood that the input gas flows to the HRM 201 from any process gas source (air source 805, nitrogen gas source 807, oxygen gas source 809, etc.) either directly or by way of the humidity control device 423 can be directed to any one or more of the gas ports 413 of the HRM 201 in a programmably selectable manner at a given time. And, any one or more of the gas ports 413 of the HRM 201 can be connected to the exhaust system 803 in a programmably selectable manner at a given time. Moreover, it should be understood that the various process gas flows to the HRM 201 can be filtered as needed and conditioned with regard to temperature.

Figure 9:
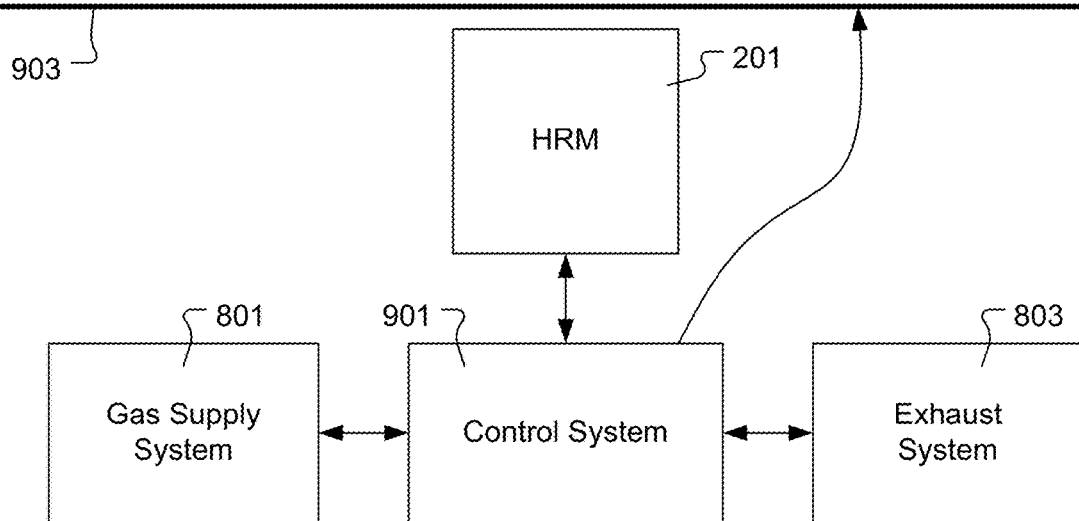
FIG. 9 shows a system-level diagram of the HRM connected to a control system, in accordance with some embodiments of the present invention.

FIG. 9 shows a system-level diagram of the HRM 201 connected to a control system 901, in accordance with some embodiments of the present invention. The control system is configured and connected to control the gas supply system 801, as described with regard to FIG. 8. Specifically, the control system 901 is configured and connected to control the flow of any process gas to the HRM 201 at a given time and control a condition of the supplied process gas with regard to humidity, and/or temperature, and/or filtering, and/or any other parameter of the supplied process gas. The control system 901 is also configured and connected to control which of the one or more gas ports 413 of the HRM 201 is to be used to supply process gas to the processing region 403 at a given time, and a flow rate of the supplied process gas(es). And, similarly, the control system 901 is configured and connected to control which of the one or more gas ports 413 of the HRM 201 is to be connected to the exhaust system 803 at a given time. The control system 901 is also configured and connected to control the humidity control device 423, the one or more radiant heating device(s) 411, the at least one heating device 409, the gas dispense device 431 (when present), the one or more heating devices 425 for the chamber 401 walls, the lift pins 405, the door 203 (when present), and any other system that interfaces with the HRM 201.

The control system 901 is also configured and connected to receive input signals from the one or more sensors 421 disposed with the processing region 403 for measuring one or more of temperature, pressure, relative humidity, or any other measurable parameter within the processing region 403 and/or directly on the substrate 102 and/or on the substrate support structure 407. In some embodiments, the control system 901 is configured to process the input signals received from the sensors 421 and generate/transmit control signals in a closed-loop feedback manner for one or more of the gas supply system 801, the exhaust system 803, the humidity control device 423, valving for the gas ports 413, the one or more radiant heating device(s) 411, the at least one heating device 409, the gas dispense device 431 (when present), the one or more heating devices 425 for the chamber 401 walls, the lift pins 405, the door 203 (when present), and any other system that interfaces with the HRM 201, so as to execute a programmed halogen management process on the substrate 102 within the HRM 201 and/or to maintain a prescribed target condition with the HRM 201 at a given time.

In some embodiments, the control system 901 is configured to provide an operator interface 903 to enable programming of a halogen management process to be performed on the substrate 102 as a function of time. As discussed in more detail below, in some embodiments, the halogen management process includes a first phase performed at or near room temperature (20° C. to 26° C.) and a second phase performed at elevated temperature (60° C. to 200° C.). Each of the first phase and the second phase can be programmed to include any number of steps. In the example of FIG. 9, the first phase includes two steps and the second phase includes two steps. Each step of each phase can be programmed to use one or more process gases at programmed flow rates. Also, each step of each phase can be programmed to have a prescribed humidity, temperature, and pressure maintained within the processing region 403. Additionally, in other embodiments, each step of each phase can be programmed to control other parameters of the HRM 201, including but not limited to: a temperature setting of the at least one heating device 409 (and each zone thereof if applicable), the one or more radiant heating device(s) 411 (if present), the gas dispense device (if present), which of the gas ports 413 are to be used as gas inputs and which of the gas ports 413 are to be used as gas outputs (exhaust), the one or more heating devices 425 for the chamber 401 walls, among others. Also, the operator interface 903 can be configured to convey various data values to enable real-time monitoring of any aspect of the halogen management process being performed within the HRM 201, such as real-time temperature, real-time pressure, real-time relative humidity, real-time gas flow rate, etc.

Figure 10:
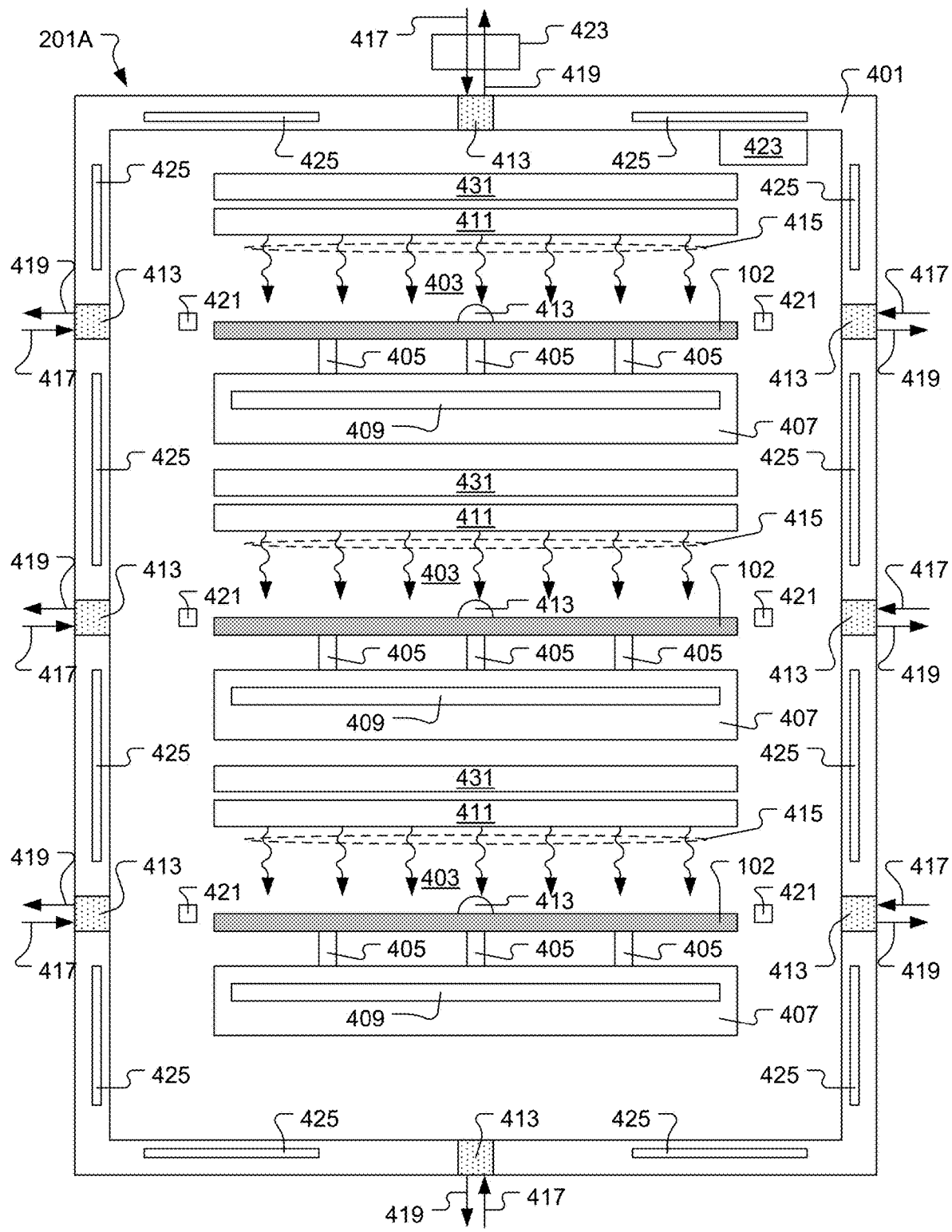
FIG. 10 shows a vertical cross-section view through the HRM configured to process multiple substrates at a time, in accordance with some embodiments of the present invention.

While the HRM 201 described above is configured to process one substrate 102 at a time, it should be understood that the HRM 201 can be extended to process multiple substrates at a given time. FIG. 10 shows a vertical cross-section view through the HRM 201A configured to process multiple substrates at a time, in accordance with some embodiments of the present invention. The HRM 201A essentially includes multiple instances of the interior components of the HRM 201 in a vertically stacked configuration. The gas ports 413 can be controlled to flow process gas(es) across each substrate 102 at each pedestal 407 location. It should be understood that in various embodiments the HRM 201A can be configured to accommodate two or more substrates 102 at a given time. In an example embodiment, the HRM 201A is configured to accommodate two substrates 102 at a given time. In another example embodiment, such as shown in FIG. 10, the HRM 201A is configured to accommodate three substrates 102 at a given time. In another example embodiment, the HRM 201A is configured to accommodate two to five substrates 102 at a given time. In another example embodiment, the HRM 201A is configured to accommodate two to ten substrates 102 at a given time. It should be understood, however, that when multiple substrates 102 are positioned within the HRM 201A for a halogen management process, the multiple substrates 102 are present in the HRM 201A from a beginning of the halogen management process to an end of the halogen management process, such that the multiple substrates 102 are processed in a substantially simultaneous and equivalent manner during the halogen management process.

Figure 11:
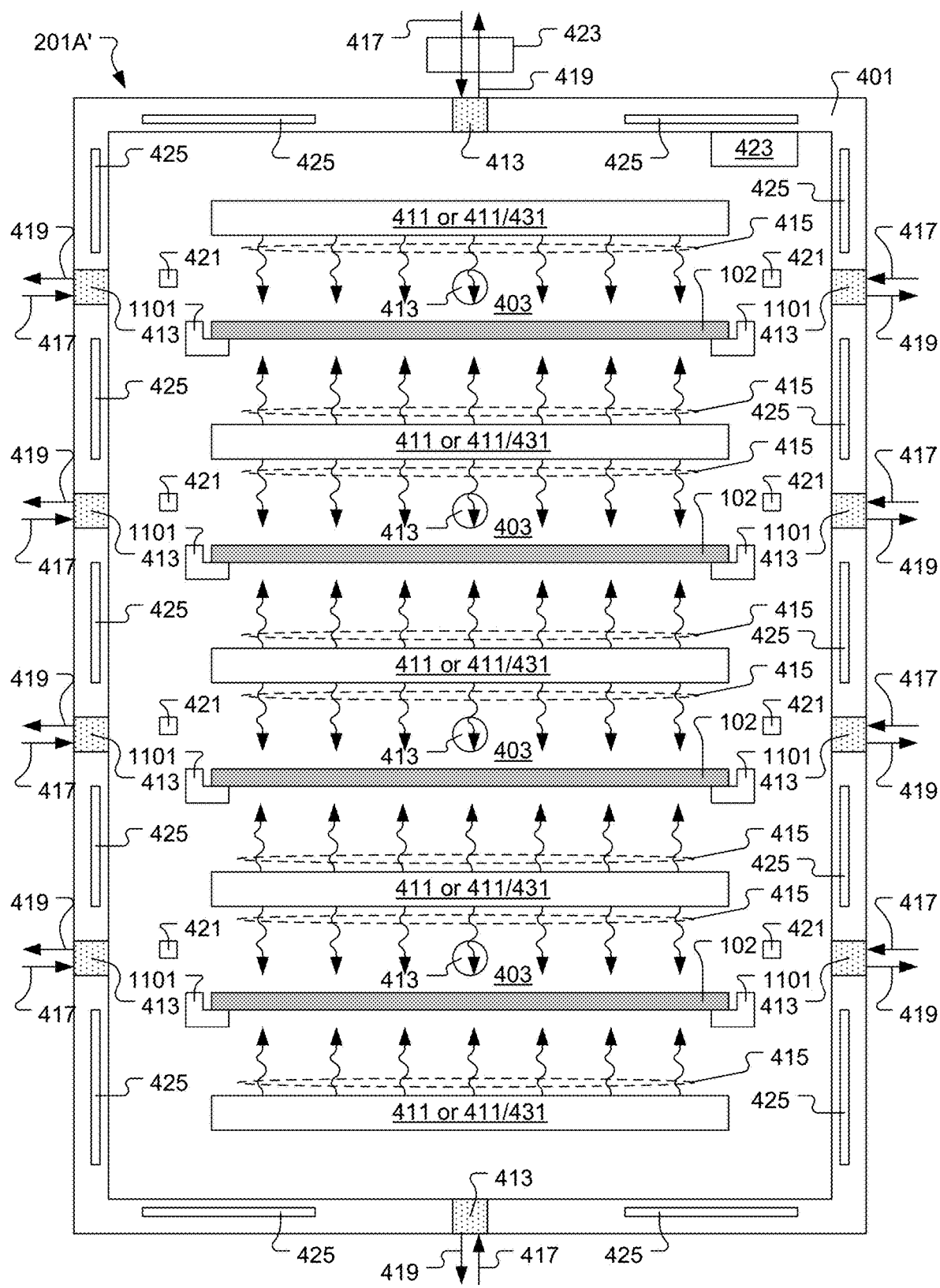
FIG. 11 shows a vertical cross-section view through another HRM configured to process multiple substrates at a time, in accordance with some embodiments of the present invention.

FIG. 11 shows a vertical cross-section view through another HRM 201A' configured to process multiple substrates 102 at a time, in accordance with some embodiments of the present invention. In the HRM 201A', the substrate support structure at each substrate support position is an edge support 1101 configured to support the substrate 102 along a peripheral edge region of the substrate 102. In the example HRM 201A' of FIG. 11, the edge supports 1101 are used in lieu of the pedestals 407 as shown in the HRM 201A of FIG. 10. It should be understood that in some embodiments the HRM 201A/201A' can include either pedestals 407, or edge supports 1101, or a combination of pedestals 407 and edge supports 1101. Also, it should be understood that the edge support 1101 can be configured in a variety of ways to support the substrate 102, so long as the substrate 102 is held safely at a location within the HRM 201A', and so long as the substrate 102 is exposed to the radiant heat emanating from the one or more radiant heating device(s) 411, and so long as the substrate 102 is exposed to the flow of process gas(es) introduced into the processing region 403 by way of one or more of the gas ports 413. It should be understood that in various embodiments the HRM 201A' can be configured to accommodate two or more substrates 102 at a given time. In an example embodiment, the HRM 201A' is configured to accommodate two substrates 102 at a given time. In another example embodiment, such as shown in FIG. 11, the HRM 201A' is configured to accommodate four substrates 102 at a given time. In another example embodiment, the HRM 201A' is configured to accommodate two to five substrates 102 at a given time. In another example embodiment, the HRM 201A' is configured to accommodate two to ten substrates 102 at a given time. It should be understood, however, that when multiple substrates 102 are positioned within the HRM 201A' for a halogen management process, the multiple substrates 102 are present in the HRM 201A' from a beginning of the halogen management process to an end of the halogen management process, such that the multiple substrates 102 are processed in a substantially simultaneous and equivalent manner during the halogen management process.

As disclosed herein, the HRM 201/201A/201A' can be configured in different ways in different embodiments, but in each configuration the HRM 201/201A/201A' is defined to provide a controlled processing region 403 that is accessible from a substrate handling module configured to maneuver substrates 102 within an environment at atmospheric pressure, such as the EFEM 109. Also, the HRM 201/201A/201A' is defined to subject the substrate(s) 102 positioned and supported therein to a halogen management process in which the substrate(s) 102 is/are exposed to a controlled flow of one or more process gas(es) (such as oxygen, nitrogen, air, etc.) while also controlling the temperature and the relative humidity to which the substrate(s) 102 is/are exposed. In various embodiments, the HRM 201/201A/201A' uses a controlled amount of oxygen gas flow and/or nitrogen gas flow and/or air flow, in combination with a controlled amount of water vapor, pressure, and temperature within a same module to optimize removal of residual halogen materials from one or more substrate(s) 102. The halogen management process performed within the HRM 201/201A/201A' can be defined as a multi-step recipe to address specific halogen material removal requirements for any type of substrate 102 and for any type of halogen material(s) without impacting substrate 102 fabrication throughput or capacity.

The primary halogen materials of concern with regard to halogen management processes performed with the HRM 201/201A/201A' include fluorine, chlorine, and bromine. It has been determined that the substrate 102 should be exposed to water and/or water vapor in order to remove fluorine from the substrate 102. However, increasing the temperature of the substrate 102 is beneficial for removal of bromine from the substrate 102, and is needed for complete removal of bromine from the substrate 102. If the substrate 102 is allowed to sit at room temperature (23° C.) in an atmospheric space (including air having some amount of water vapor), the fluorine within the substrate 102 will off-gas to reach an asymptotic value (non-zero) within the substrate 102 in about 15 minutes, and chlorine within the substrate 102 will off-gas to reach an asymptotic value (non-zero) within the substrate 102 in about 9 minutes, and bromine within the substrate 102 will off-gas to reach its limit (non-zero) of off-gassing at room temperature in about 3 minutes. Exposure of the substrate 102 to heat and water/water vapor and/or oxygen is needed to get bromine to off-gas from the substrate 102 beyond its limit of off-gassing at room temperature. In other words, the temperature of the substrate 102 should be increased while exposing the substrate 102 to water vapor and/or oxygen to get bromine to off-gas from the substrate 102 beyond its limit of off-gassing at room temperature. Also, extremely small and fragile structures can be exposed on the substrate 102 at various stages of semiconductor device fabrication when a halogen management process is needed. Therefore, due to the potential for damaging these extremely small and fragile structures on the substrate 102, it is not desirable to expose the substrate 102 to bulk liquid water during the halogen management process.

In some situations, the EFEM 109 can be operated to have a very low (even zero) amount of water vapor within its interior ambient environment. In these situations, halogen materials will not off-gas from the substrate 102 due to the lack of exposure of the substrate 102 to water vapor. The lack of water vapor within the interior ambient environment of the EFEM 109 can help protect the EFEM 109 and interfacing equipment from corrosion, but does not allow for off-gassing of halogen materials from the substrate 102 until the substrate 102 is moved out of the EFEM 109. Because halogen materials are reactive non-metallic elements that form strong acidic compounds with hydrogen, leading to formation of simple salts, unmanaged off-gassing of halogen materials from the substrate 102 within the fabrication facility can lead to many problems, including corrosion, contamination, and particulate formation, among others. Therefore, it should be appreciated that by having the HRM 201/201A/201A' accessible from within the EFEM 109, a controlled halogen management process can be performed on the substrate 102 within the HRM 201/201A/201A' before the substrate 102 leaves the EFEM 109 to continue its fabrication.

Also, by operating the HRM 201/201A/201A' at a pressure slightly less than a pressure within the interior ambient environment of the EFEM 109, by-products from the halogen management process performed within the HRM 201/201A/201A' can be prevented from getting into the EFEM 109. For example, if the interior ambient environment of the EFEM 109 is maintained at atmospheric pressure (760 Torr), the pressure within the HRM 201/201A/201A' can be maintained at less than 760 Torr, such as at about 755 Torr, to ensure a unidirectional flow of environmental gas(es) from the EFEM 109 into the HRM 201/201A/201A'. In some embodiments, the exhaust system 803 can be operated to maintain a slightly negative pressure within the HRM 201/201A/201A' relative to the EFEM 109.

In some embodiments, the HRM 201/201A/201A' includes the door 203 configured to provide a seal between the processing region 403 within the HRM 201/201A/201A' and the environment within the EFEM 109. In these embodiments, it is possible to increase the pressure within the HRM 201/201A/201A' to be greater than the pressure within the EFEM 109. In some embodiments, the gas(es) supplied to the processing region 403 can be controlled relative to the exhaust from the processing region 403 to cause the increase in pressure within the processing region 403. In these embodiments, no gas exchange will occur between the environment within the EFEM 109 and the processing region 403 within the HRM 201/201A/201A' during processing of the substrate 102 within the HRM 201/201A/201A', and the gas(es) within the processing region 403 will be removed from the HRM 201/201A/201A' through one or more of the gas ports 413.

FIG. 12 shows a flowchart of a method for managing residual halogens emanating from a substrate, in accordance with some embodiments of the present invention. In some embodiments, the method is performed within a chamber accessible directly from a substrate handling module configured to maneuver substrates within an environment at atmospheric pressure. For example, in some embodiments, the method is performed in the HRM 201/201A/201A'. And, in some embodiments, the HRM 201/201A/201A' can be disposed in a location where it is accessible from the EFEM 109. The method includes a first operation 1201 in which for a first period of time, the substrate is exposed to a flow of at least one gas while maintaining a relative humidity in exposure to the substrate at about 100%, and while maintaining a temperature of the substrate within a range extending from about 20° C. to about 26° C. In some embodiments, the temperature of the substrate during the first period of time is maintained at about 23° C. In some embodiments, the first period of time is set to allow for a substantially complete off-gassing of fluorine from the substrate. In some embodiments, the first period of time is from about 2 minutes to about 15 minutes. In some embodiments, the first period of time is about 10 minutes.

In some embodiments, the at least one gas for the first period of time is one or more of oxygen, nitrogen, and air. However, it should be understood that in other embodiments, the at least one gas for the first period of time can be any type of gas that is effective at facilitating removal of residual halogen materials from the substrate and that is chemically compatible with materials present on the substrate so as to avoid causing damage to the substrate and features present thereon. In some embodiments, a flow rate of the at least one gas for the first period of time is within a range extending from about 60 standard liters per minute (slm) to about 200 slm.

The method also includes a second operation 1203 in which for a second period of time following the first period of time of operation 1201, the substrate is exposed to a flow of at least one gas while maintaining a relative humidity in exposure to the substrate within a range extending from about 50% to about 100%, and while maintaining a temperature of the substrate within a range extending from about 60° C. to about 200° C. In some embodiments, the second period of time is set to allow for a substantially complete off-gassing of bromine and chlorine from the substrate. It should be understood and appreciated that the substrate is maintained in the same processing environment during both the first period of time of operation 1201 and the second period of time of operation 1203. In some embodiments, the second period of time is from about 2 minutes to about 15 minutes. In some embodiments, the second period of time is about 5 minutes.

In some embodiments, the at least one gas for the second period of time is one or more of oxygen, nitrogen, and air. However, it should be understood that in other embodiments, the at least one gas for the second period of time can be any type of gas that is effective at facilitating removal of residual halogen materials from the substrate and that is chemically compatible with materials present on the substrate so as to avoid causing damage to the substrate and features present thereon. In some embodiments, a flow rate of the at least one gas for the first period of time is within a range extending from about 60 slm to about 200 slm. In some embodiments, a pressure within the processing environment is maintained at less than 760 Torr during both the first period of time of operation 1201 and the second period of time of operation 1203. In some embodiments, the pressure within the processing environment is maintained at about 755 Torr during both the first period of time of operation 1201 and the second period of time of operation 1203. In some embodiments, the pressure within the processing environment is maintained at about 1500 Torr during both the first period of time of operation 1201 and the second period of time of operation 1203.

It should be understood that the method of FIG. 12 represents a halogen management process having two phases, where the first phase is performed at low temperature, e.g., at room temperature (about 23° C.), and the second phase is performed at high temperature, e.g., within a range extending from about 60° C. to about 200° C. Therefore, the first phase of the method, i.e., operation 1201, avoids fluorine-lock due to increased substrate temperature. And, the duration of the first phase is defined to allow for a substantially complete off-gassing of fluorine from the substrate. Then, the second phase of the method, i.e., operation 1203, is conducted with the substrate at elevated temperature to drive off bromine from the substrate. The duration of the second phase is defined to allow for a substantially complete off-gassing of bromine from the substrate. It should be noted that chlorine off-gasses from the substrate during both the first phase (operation 1201) and the second phase (operation 1203). Therefore, the total duration of the first and second phases, i.e., the sum of the first period of time of operation 1201 and the second period of time of operation 1203, should be at least long enough to allow for a substantially complete off-gassing of chlorine from the substrate. It should be appreciated that by performing the first phase (operation 1201) at low temperature before performing the second phase (operation 1203) at high temperature, it is possible to remove residual fluorine from the substrate in a substantially complete manner.

In some embodiments, the halogen management process can include a single combined phase in lieu of the first and second phases discussed above or in addition to the first phase and/or second phase discussed above. In some embodiments, the single combined phase is performed at a temperature within a range extending from about 80° C. to about 100° C. and at a relative humidity within a range extending from about 70% to about 100%. For example, in some embodiments, the HRM 201/201A/201A' can be used to perform only operation 1201 on the substrate 102 for a specific amount of time in order to completely outgas a specific halogen of interest. And, in some embodiments, the HRM 201/201A/201A' can be used to perform only operation 1201 on the substrate 102 for a specific amount of time in order to completely outgas a specific halogen of interest.

Prior to the HRM 201/201A/201A' and systems and methods disclosed herein, there was no single solution for managing all halogen types of concern (fluorine, chlorine, and bromine) within a common processing region. Some prior attempts at managing residual halogen materials utilized a spin/rinse/dry (SRD) processing module connected to the vacuum transfer module 101. However, use of the SRD was non-optimal for a number of reasons. For instance, exposure of the substrate to bulk liquid water in the SRD significantly increases the likelihood of damaging fragile materials and structures present on the substrate. Also, the SRD takes up a facet of the transfer module 101, which prevents connection of a more needed process module to the transfer module 101, which in turn adversely affects substrate fabrication throughput and capacity. Similarly, other prior attempts at managing residual halogen materials included connection of a process module to the transfer module 101, which again adversely affects substrate fabrication throughput and capacity. For example, connection of a microwave stripper process module to the transfer module 101 for use in managing residual halogen materials decreases the number of available facets on the transfer module 101 for connection of other needed process modules, which decreases substrate fabrication throughput.

Also, connection of a process module 105A-105D to the vacuum module 101 for the purpose of managing residual halogen materials is inefficient because the process module will have to operate under non-vacuum conditions and then always be pumped back down to vacuum (which takes time) to allow exposure of the interior of the process module to the transfer module 101. Moreover, simply using a buffer station in the EFEM 109 to rest substrates to allow for off-gassing of halogen materials from the substrates ignores the corrosion and contamination problems caused by release of halogen materials within the interior ambient environment of the EFEM 109. Additionally, it should be understood that if natural off-gassing of residual halogen materials from substrates is relied upon for halogen management, the buffer stations in the EFEM 109 will be unacceptably impacted due to the long time required for natural off-gassing of residual halogen materials from substrates, which will adversely affect substrate fabrication throughput.

Given the foregoing, it should be appreciated that because the HRM 201/201A/201A' is connected on the atmospheric pressure side of the transfer module 101, and is accessible from the EFEM 109, deployment and use of the HRM 201/201A/201A' does not adversely impact substrate fabrication throughput, and in fact improves substrate fabrication throughput. Also, it should be appreciated that by having the HRM 201/201A/201A' connected to the EFEM 109, the HRM 201/201A/201A' does not take up a facet of the transfer module 101, thereby improving substrate fabrication throughput. Also, it should be appreciated that because the HRM 201/201A/201A' can be operated at a negative pressure relative to the EFEM 109, the HRM 201/201A/201A' can be used to minimize halogen exposure within the EFEM 109. Also, in some embodiments, the HRM 201/201A/201A' can be closed off from the EFEM 109 during halogen management processing of the substrate 102 within the HRM 201/201A/201A'. And, in these embodiments, the HRM 201/201A/201A' can be operated at any pressure, including increased pressure relative to the EFEM 109, while minimizing halogen exposure within the EFEM 109.

The HRM 201/201A/201A' and associated systems and methods disclosed herein provide for performance of a halogen management process on one or more substrate(s), where the halogen management process can include variation of multiple process parameters as a function of time within a common processing region. Because the HRM 201/201A/201A' can be deployed at a location directly accessible from the EFEM 109, it is logistically feasible to implement the HRM 201/201A/201A' within the fabrication facility. Also, it should be understood that the HRM 201/201A/201A' and associated systems and methods disclosed herein can be used for any type of substrate and for management of any type of halogen material. The HRM 201/201A/201A' and associated systems and methods disclosed herein provide a consolidated approach to halogen management that serves to decrease overall cost and complexity associated with halogen management while also increasing substrate fabrication throughput and capacity.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A system for halogen removal, comprising:
   a chamber formed to enclose a processing region, wherein the chamber is connected to an equipment front end module that is configured to operate under an atmospheric pressure condition;
   a passageway into the chamber, the passageway configured to provide for entry of a substrate into the processing region and removal of the substrate from the processing region;
   a substrate support structure disposed within the processing region and configured to support the substrate within the processing region;
   at least one gas input connected to a nitrogen supply, the at least one gas input configured to supply nitrogen to the processing region;
   at least one gas output configured to exhaust gases from the processing region;
   at least one heater disposed to provide temperature control of the substrate within the processing region; and
   a control system programmed to, for a first period of time, direct supply of the nitrogen in combination with a first amount of water vapor to the at least one gas input in conjunction with directing exhaust of gas from the at least one gas output to expose the substrate to a flow of the nitrogen and the first amount of water vapor while also directing operation of the at least one heater to maintain a temperature of the substrate within a range extending from about 20° Celsius (C) to about 26° C., the first period of time set to allow for a substantially complete off-gassing of fluorine from the substrate, and wherein the control system is programmed to, for a second period of time following the first period of time, direct supply of the nitrogen in combination with a second amount of water vapor to the at least one gas input in conjunction with directing exhaust of gas from the at least one gas output to expose the substrate to a flow of the nitrogen and the second amount of water vapor while also directing operation of the at least one heater to maintain a temperature of the substrate within a range extending from about 60° C. to about 200° C., the second period of time set to allow for a substantially complete off-gassing of bromine and chlorine from the substrate.

2. The system for halogen removal as recited in claim 1, wherein the chamber is configured to receive and process one substrate at a given time.

3. The system for halogen removal as recited in claim 1, wherein the chamber is configured to receive and process multiple substrates at a given time.

4. The system for halogen removal as recited in claim 1, further comprising:
   a door configured to shield an environment exterior to the chamber from the processing region.

5. The system for halogen removal as recited in claim 1, wherein the substrate support structure is a pedestal.

6. The system for halogen removal as recited in claim 5, wherein the at least one heater is at least one resistive heater disposed within the pedestal.

7. The system for halogen removal as recited in claim 1, wherein the substrate support structure is an edge support configured to support the substrate along a peripheral edge region of the substrate.

8. The system for halogen removal as recited in claim 7, wherein the at least one heater is at least one radiative heater disposed to direct radiant heat toward the substrate when present on the edge support.

9. The system for halogen removal as recited in claim 1, wherein the at least one heater includes one or more of a resistive heater and a radiative heater.

10. The system for halogen removal as recited in claim 1, wherein the at least one gas input is connected to a supply of one or more of oxygen and air in addition to nitrogen.

11. The system for halogen removal as recited in claim 1, wherein the at least one gas input and the at least gas output are configured and positioned to provide a controlled gas flow profile across the substrate when present on the substrate support structure.

12. The system for halogen removal as recited in claim 1, further comprising:
   at least one heater disposed to heat surfaces of the chamber exposed to the processing region.

13. The system for halogen removal as recited in claim 1, wherein the control system is programmed to control a duration of the first period of time within a range extending from about 2 minutes to about 15 minutes, and wherein the control system is programmed to control a duration of the second period of time within a range extending from about 2 minutes to about 15 minutes.

14. The system for halogen removal as recited in claim 1, wherein the control system is further configured to control the first amount of water vapor and the second amount of water vapor.

15. The system for halogen removal as recited in claim 14, wherein the control system is configured to control combination of the first amount of water vapor and the second amount of water vapor with the nitrogen at a location between the nitrogen supply and the at least one gas input.

16. The system for halogen removal as recited in claim 14, wherein the control system is programmed to maintain a relative humidity in exposure to the substrate at about 100% during the first period of time, and wherein the control system is programmed to maintain the relative humidity in exposure to the substrate within a range extending from about 50% to about 100% during the second period of time.

17. A method for managing residual halogens emanating from a substrate, comprising:
   having a system for halogen removal that includes:
      a chamber formed to enclose a processing region, wherein the chamber is connected to an equipment front end module that is configured to operate under an atmospheric pressure condition,
      a passageway into the chamber, the passageway configured to provide for entry of a substrate into the processing region and removal of the substrate from the processing region,
      a substrate support structure disposed within the processing region and configured to support the substrate within the processing region,
      at least one gas input connected to a nitrogen supply, the at least one gas input configured to supply nitrogen to the processing region,
      at least one gas output configured to exhaust gases from the processing region,
      at least one heater disposed to provide temperature control of the substrate within the processing region, and
      a control system programmed to, for a first period of time, direct supply of the nitrogen in combination with a first amount of water vapor to the at least one gas input in conjunction with directing exhaust of gas from the at least one gas output to expose the substrate to a flow of the nitrogen and the first amount of water vapor while also directing operation of the at least one heater to maintain a temperature of the substrate within a range extending from about 20° Celsius (C) to about 26° C., the first period of time set to allow for a substantially complete off-gassing of fluorine from the substrate, and
      wherein the control system is programmed to, for a second period of time following the first period of time, direct supply of the nitrogen in combination with a second amount of water vapor to the at least one gas input in conjunction with directing exhaust of gas from the at least one gas output to expose the substrate to a flow of the nitrogen and the second amount of water vapor while also directing operation of the at least one heater to maintain a temperature of the substrate within a range extending from about 60° C. to about 200° C., the second period of time set to allow for a substantially complete off-gassing of bromine and chlorine from the substrate;
   placing the substrate on the substrate support structure within the halogen removal module;
   operating the control system to, for the first period of time, supply nitrogen and the first amount of water vapor to the at least one gas input in conjunction with exhausting gas from the at least one gas output to expose the substrate to the flow of the nitrogen and the first amount of water vapor while operating the at least one heater to maintain a temperature of the substrate within a range extending from about 20° Celsius (C) to about 26° C., the first period of time set to allow for a substantially complete off-gassing of fluorine from the substrate; and
   operating the control system to, for the second period of time following the first period of time, supply nitrogen and the second amount of water vapor to the at least one gas input in conjunction with exhausting gas from the at least one gas output to expose the substrate to the flow of the nitrogen and the second amount of water vapor while operating the at least one heater to maintain a temperature of the substrate within a range extending from about 60° C. to about 200° C., the second period of time set to allow for a substantially complete off-gassing of bromine and chlorine from the substrate,
   wherein the substrate is maintained in the processing region of the halogen removal module during both the first period of time and the second period of time.

18. The method as recited in claim 17, wherein the first period of time is from about 2 minutes to about 15 minutes, and the second period of time is from about 2 minutes to about 15 minutes.

19. The method as recited in claim 17, wherein the first period of time is about 10 minutes.

20. The method as recited in claim 17, wherein the second period of time is about 5 minutes.

21. The method as recited in claim 17, further comprising:
   combining one or more of oxygen and air in the flow of the nitrogen during the first period of time; and
   combining one or more of oxygen and air in the flow of the nitrogen during the second period of time.

22. The method as recited in claim 17, wherein a flow rate of the nitrogen through the at least one gas input during the first period of time is within a range extending from about 60 standard liters per minute (slm) to about 200 slm, and wherein a flow rate of the nitrogen through the at least one gas input during the second period of time is within a range extending from about 60 standard liters per minute (slm) to about 200 slm.

23. The method as recited in claim 17, wherein the temperature of the substrate during the first period of time is maintained at about 23° C.

24. The method as recited in claim 17, wherein a pressure within the processing environment is maintained at less than 1500 Torr during both the first period of time and the second period of time.

25. The method as recited in claim 17, wherein the pressure within the processing environment is maintained at less than 760 Torr during both the first period of time and the second period of time.

26. The method as recited in claim 17, further comprising:
   maintaining a relative humidity in exposure to the substrate at about 100% during the first period of time; and
   maintaining the relative humidity in exposure to the substrate within a range extending from about 50% to about 100% during the second period of time.

* * * * *